United States Patent [19]

Miller

[11] Patent Number: 5,200,802

[45] Date of Patent: Apr. 6, 1993

[54] SEMICONDUCTOR ROM CELL PROGRAMMED USING SOURCE MASK

[75] Inventor: William E. Miller, Los Gatos, Calif.

[73] Assignee: National Semiconductor Corporation, Santa Clara, Calif.

[21] Appl. No.: 902,516

[22] Filed: Jun. 22, 1992

Related U.S. Application Data

[63] Continuation of Ser. No. 705,678, May 24, 1991, abandoned.

[51] Int. Cl.[5] ............... H01L 29/78; H01L 27/10; H01L 29/06
[52] U.S. Cl. ................... 257/390; 257/391; 365/104
[58] Field of Search ............ 357/23.12, 23.9, 45, 357/91

[56] References Cited
U.S. PATENT DOCUMENTS

| | | | |
|---|---|---|---|
| 4,268,950 | 5/1981 | Chatterjee et al. | 357/23.12 |
| 4,356,041 | 10/1982 | Kosa | 357/91 |
| 4,358,889 | 11/1982 | Dickman et al. | 437/48 |
| 4,395,725 | 7/1983 | Parekh | 357/23.12 |
| 4,420,871 | 12/1983 | Scheibe | 357/43 |
| 4,513,494 | 4/1985 | Batra | 357/91 |
| 4,603,468 | 8/1986 | Lam | 357/23.7 |
| 4,649,629 | 3/1987 | Miller et al. | 357/91 |
| 4,694,566 | 9/1987 | Conner et al. | 437/48 |
| 4,775,642 | 10/1988 | Chang et al. | 437/44 |
| 4,845,045 | 7/1989 | Shacham et al. | 437/30 |

Primary Examiner—Rolf Hille
Assistant Examiner—Robert Limanek
Attorney, Agent, or Firm—Irving S. Rappaport; Robert C. Colwell; Jeanne C. Suchodolski

[57] ABSTRACT

ROM cell programmed ON has N+ source implant spaced a given distance from the gate with LDD bridging the gap between the N+ source and the N channel. ROM cell programmed OFF has P+ implanted into this gap so as to completely override the LDD in this gap. The P+ prevents the N channel from forming ohmic connection to the N+ source.

22 Claims, 12 Drawing Sheets

SEMICONDUCTOR ROM CELL PROGRAMMED USING SOURCE MASK

This is a continuation of application Ser. No. 07/705,678 filed May 24, 1991, now abandoned.

BACKGROUND OF THE INVENTION

A read only memory (ROM) is a semiconductor memory which has permanently stored information that can be read, but not erased or rewritten. In most applications, the information stored in the ROM is written into the memory during manufacture of the ROM memory device. FIG. 1 is a cross-sectional view of a conventional ROM semiconductor device in the x-z plane. The device shown has a first cell 1 adapted to store a "1" and a second cell 2 adapted to store a "0". Each cell contains a drain region having a heavily doped portion 4 and a lightly doped portion 6, a gate electrode 8, and a source region having a heavily doped portion 10 and a lightly doped portion 12. Cells 1 and 2 are separated from each other by field oxide region 16. Gate 8 of each cell is insulated from source 10 and drain 6 by oxide layers 17, 18 and 19 as shown.

In cell 2, the thickness of oxide layer 19 underneath gate 8 is significantly less than the thickness of the oxide layer 17 underneath gate 8 of cell 1. This difference represents the information content of the cell. When an appropriate positive voltage is applied to gate 8 of cell 2, an electric field of sufficient magnitude is generated to create a temporary N type channel (not shown) between regions 6 and 10. Current then flows through the transistor device of cell 2 when a voltage is applied at gate 8. The transistor of cell 2 is in the "on" or active state and the cell registers a "0".

When the voltage applied to gate 8 of cell 2 is applied to gate 8 of cell 1, the greater thickness of oxide layer 17 prevents formation of an electric field strong enough to allow current to pass from drain to source. The transistor of cell 1 thus does not turn "on" when this voltage is applied to its gate 8. Cell 1 is in an inactive state and reads a "1". Of course, the "0" and "1" are simply conventions. Off cells can be considered as "0" cells, and on cells as "1" cells.

The structure of the conventional ROM cell 2, however, is subject to electrical breakdown of the gate oxide: a phenomenon known as gate oxide rupture. Unfortunately, during plasma etching to define the polycrystalline silicon (polysilicon) gate regions 8 on the wafer surface, or during ion implantation, the polysilicon gate regions can retain charge. A voltage thus develops between the polysilicon gate region 8 and the underlying substrate. The magnitude of the voltage is a function of the oxide thickness. For a unit area of oxide, the voltage between the polysilicon gate region and the substrate increases as the oxide thickness increases. Conversely, the voltage between the substrate and the polysilicon gate region decreases as the oxide thickness decreases.

FIG. 2 shows a cross section of the gate region of cell 2 in the y-z plane. For the reasons discussed above, in ROM cell 2, gate oxide rupture occurs and ROM cell 2 does not function properly. The voltage on the gate oxide is given by $$V = \frac{\text{Total Charge}}{\text{Total Capacitance}} = \frac{QA}{C_g A_g + C_f A_f} \quad (1)$$

Where:
- Q = Charge per unit area
- A = Area
- C = Capacitance per unit area
- g = gate
- f = field oxide This equation can be rewritten as:

$$\frac{V}{t_g} = \frac{\frac{Q}{\epsilon_{ox}}\left(1 + \frac{A_f}{A_g}\right)}{1 + \frac{t_g A_f}{t_f A_g}} \quad (2)$$

by noting that the unit capacitance can be expressed as: $\epsilon_{ox}/t$ where: $\epsilon_{ox}$ = oxide dielectric constant and t = the oxide thickness. Gate oxide rupture occurs when $V/t_g > 10$ V/100 Å. Therefore from equation (2) above, rupture is most likely to occur if $A_f/A_g$ large when $t_g/t_f$ is small, or approximately 1/30. Thus, in the diagram of FIG. 2 rupture occurs when the ratio of the areas of regions 18 and 19 is large while the ratio of thicknesses of region 19 to region 18 is small.

In prior art ROM devices the field oxide thickness was about 6000 Å and the gate oxide thickness was about 800 Å, or a ratio of 7.5 to 1. At this ratio, the potential differences are such that gate oxide rupture is a relatively infrequent phenomenon. Technological advances in integrated circuit fabrication technology, however, have greatly improved device densities by scaling feature sizes in the z direction (as well as x and y directions). As a result, the thickness ratio between the field oxide region and the gate oxide region has been significantly altered. Newer devices may have ratios of field oxide thickness to gate oxide thickness of 6000 Å to 200 Å, or 30 to 1. For newer devices, with a polysilicon geometry mostly over field oxide and its small remaining area over gate oxide, the rupture of this gate oxide is much more likely to occur than in older, larger devices.

SUMMARY OF THE INVENTION

The present invention provides a ROM cell structure and process for making a ROM cell structure which does not rely on using gate oxide or field oxide to program the ROM cell in the "on" or "off" condition. The likelihood of gate oxide rupture in cells programmed with such a structure is thereby greatly reduced.

According to one embodiment of the present invention, a ROM cell, for example, an N channel device, has a P+ conductivity type implant inserted between the N+ conductivity type source and its channel. The P+ type implant creates a reverse junction diode and prevents ohmic connection to the N channel extending from the drain toward the source. A ROM cell having this P+ type implant is therefore programmed to the inactive state or "off". A ROM cell constructed to be "on" does not include this P+ type implant. In other words, application of a selected potential will only turn on the ROM cells without the P-type implant, not those without it. The resulting ROM device thus does not require that field oxide be used rather than gate oxide to program individual cells in the on and off states. Since the poly row line contains all cells with their gates having gate oxide and no cells having field oxide gates, then $A_f/A_g$ is minimized. Furthermore, the technique permits those cells programmed to the off, or inactive state, to be visually indistinguishable from those cells programmed to the on, or active state. This feature prohibits visual inspection and provides security from unauthorized reuse of the ROM program code.

According to another embodiment of the present invention, a typical source/drain P+ type implant is made after formation of the drain and source N+ type implants, but prior to formation of metal layers on the wafer. A typical P+ implant has a concentration density of $1 \times 10^{19}$ atoms/cm$^3$ and forms a leaky diode at the P+/N+ interface. The source of the resulting transistor thus is tied to the body of the device. The resulting ROM array is formed in a "T" layout of these devices.

According to yet another embodiment of the present invention, the ROM array may be formed in an "X" layout to improve the ROM cell density per unit area over densities achieved using the "T" layout. Furthermore, in the "X" layout structure, a programming mask can be used after metallization. The P+/N+ diode is not leaky due to a reduced dopant concentration, and the source of the transistor need no longer be tied to the body.

DESCRIPTION OF THE PREFERRED EMBODIMENT

Figure 3:
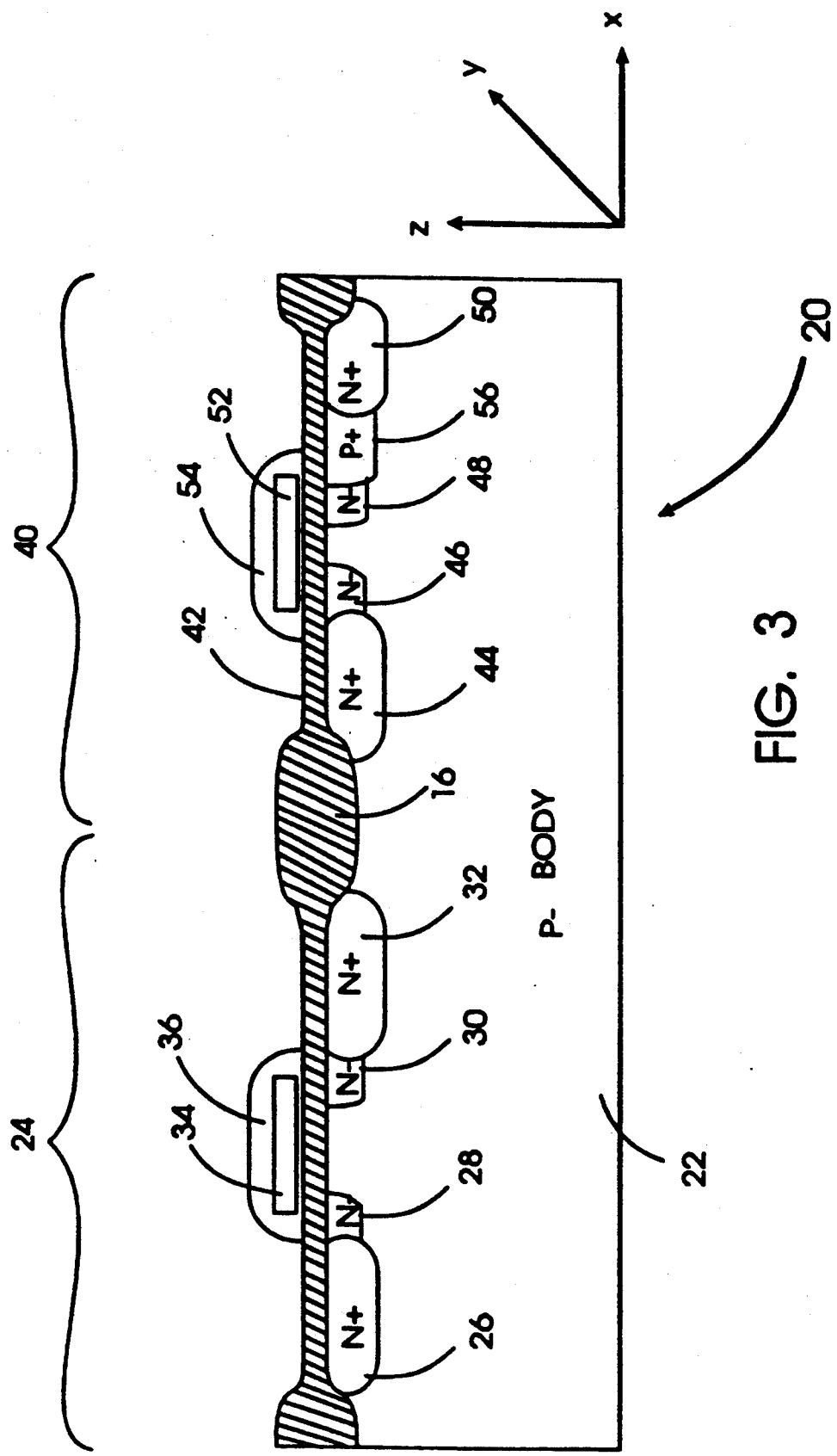
FIG. 3 is a cross-sectional view of a ROM device constructed according to an embodiment of the present invention.

FIG. 3 depicts a cross section of a ROM device 20 constructed on a P− conductivity type semiconductor silicon substrate 22 according to an embodiment of the present invention. Although it should be understood that in a commercial embodiment a ROM will include thousands or millions of cells, for the purpose of explanation ROM device 20 is shown as including a first cell 24 and a second cell 40. The first cell 24 includes a drain which may be composed of a more heavily doped N+ type region 26 and a lightly doped N-region 28. A source of cell 24 maybe composed of a lightly doped N-region 30 and an N+ type region 32. A gate insulating layer 34, typically silicon dioxide, is disposed between polycrystalline silicon gate 36 and the cell substrate. The thickness of this layer is not dependent on the information to be stored in the ROM cells.

Oxide layer 34 is formed thin enough, typically 100 Å to 200 Å, such that when a positive voltage is applied to gate 36, an electric field of sufficient magnitude is generated to create a temporary N type channel (not shown) and current flows through the transistor. The transistor of cell 24 thus is programmed in the "on", or active state, and conventionally such a cell is "read" as a "0" whenever that cell is addressed.

Figure 4:
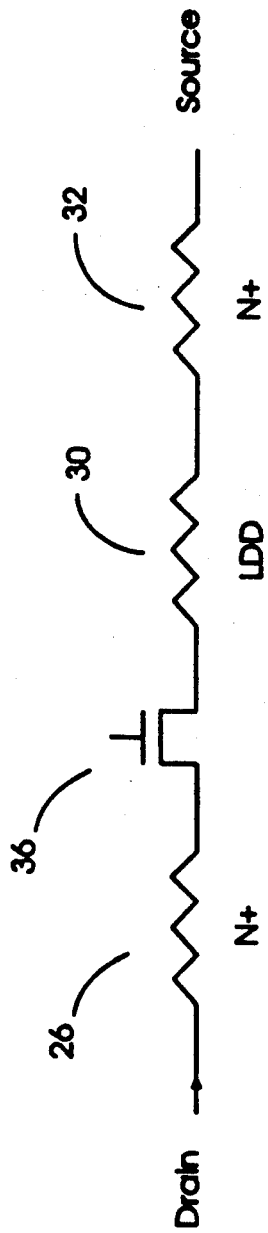
FIG. 4 is a schematic of a ROM cell programmed in an active state according to an embodiment of the present invention.

FIG. 4 depicts the schematic diagram for ROM cell 24. The resistance of the N+ type drain 26 is shown in series with the gate 36, the lightly doped portion 30 of the source and the N+ source 32. The resistance of lightly doped portion 28 of the drain is not shown in FIG. 4 since its electrical resistance is insignificant and less than ten percent of lightly doped portion 30.

ROM device 20 in FIG. 3 also contains another cell 40. Field oxide 42 is used to electrically isolate cell 24 from cell 40, and typically encircles groups of cells sharing a common source region on the substrate to isolate those cells from other nearby cells. Cell 40 is constructed in similar fashion to cell 24 and has a drain composed of an N+ type region 44 and lightly doped region 46 and a source composed of lightly doped region 48 and N+ type region 50. An oxide region 52 also separates polysilicon gate 54 from substrate 22. In cell 40, however, P+ type dopant has been diffused or implanted into region 48 to form a P+ region 56 adjacent region 50, thereby creating a diode blocking ohmic content which prevents the cell from operating, as described below. The P+ region dopant is 1 μm wide. Thus, cell 40 is in the "off" or inactive state and when read is considered to store a "1".

Figure 5:
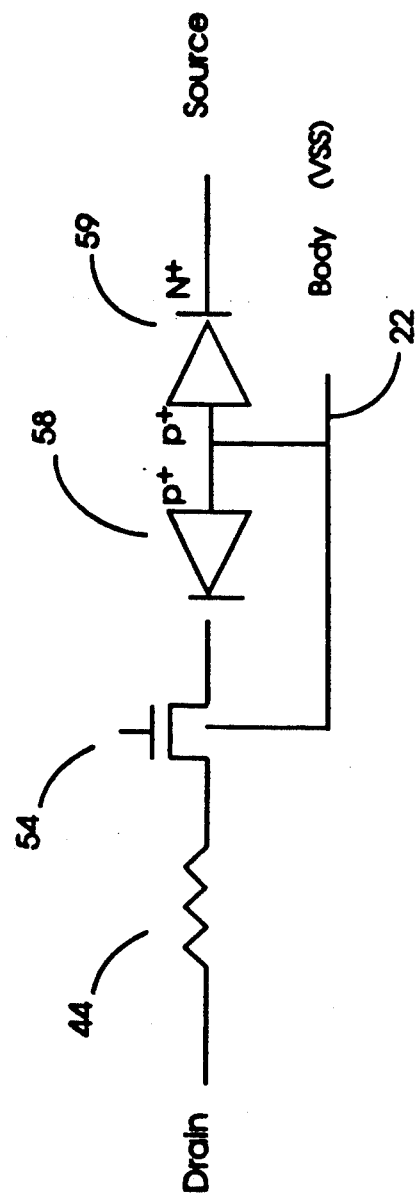
FIG. 5 is a schematic of a ROM cell programmed in an inactive state according to an embodiment of the present invention.

FIG. 5 is a schematic diagram of cell 40, in which P+ type implant region 56 forms diodes 58 and 59 between source contact 50 and lightly doped region 48. Thus, there exists a reverse biased junction to the channel. In operation, when a voltage is applied to gate 54 of cell 40, the reverse biased junction resulting from P+ implant 56 prevents the formation of a channel between regions 44 and 50. The transistor of cell 40 therefore remains nonconductive. Cell 40 thus is always off and by convention, the value of the cell is "1" whenever addressed.

Figure 1:
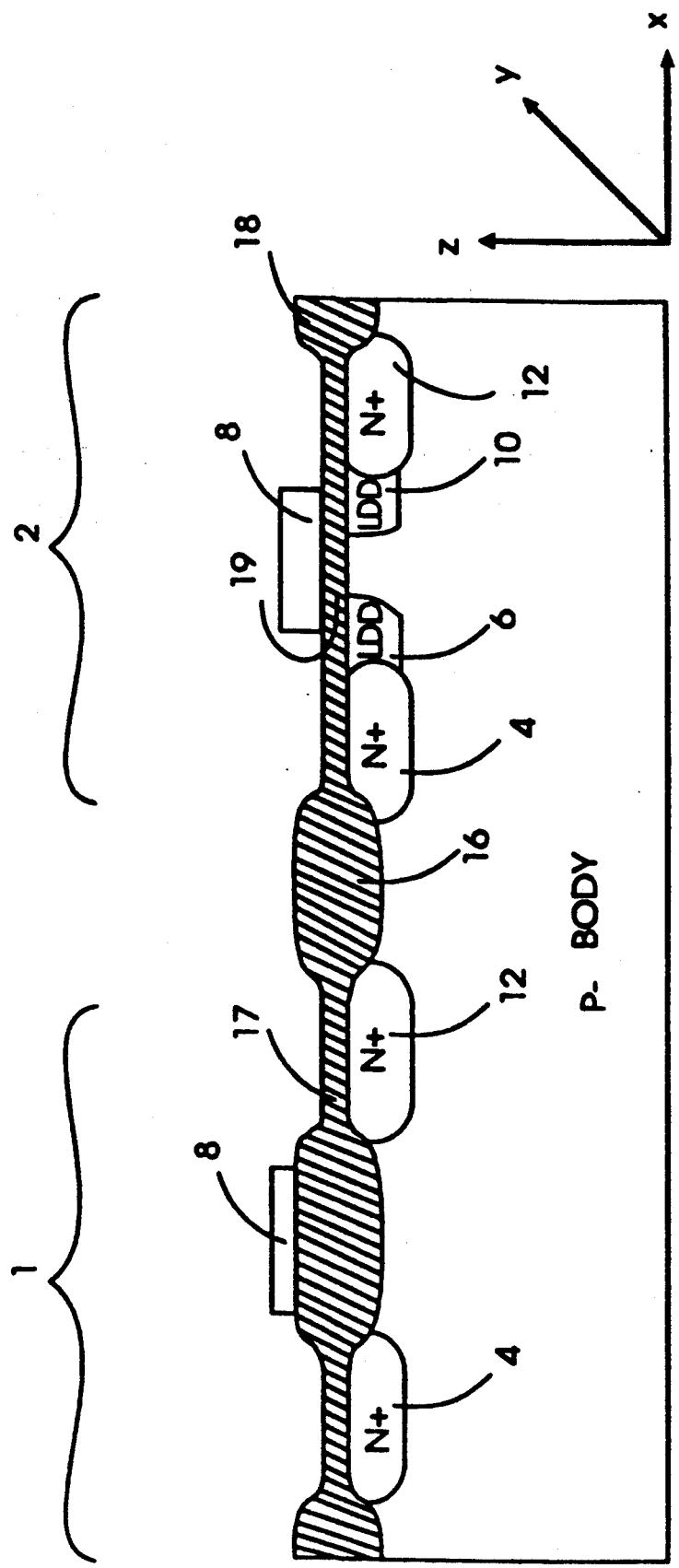
FIG. 1 is a cross-sectional view of a prior art ROM device.
Figure 2:
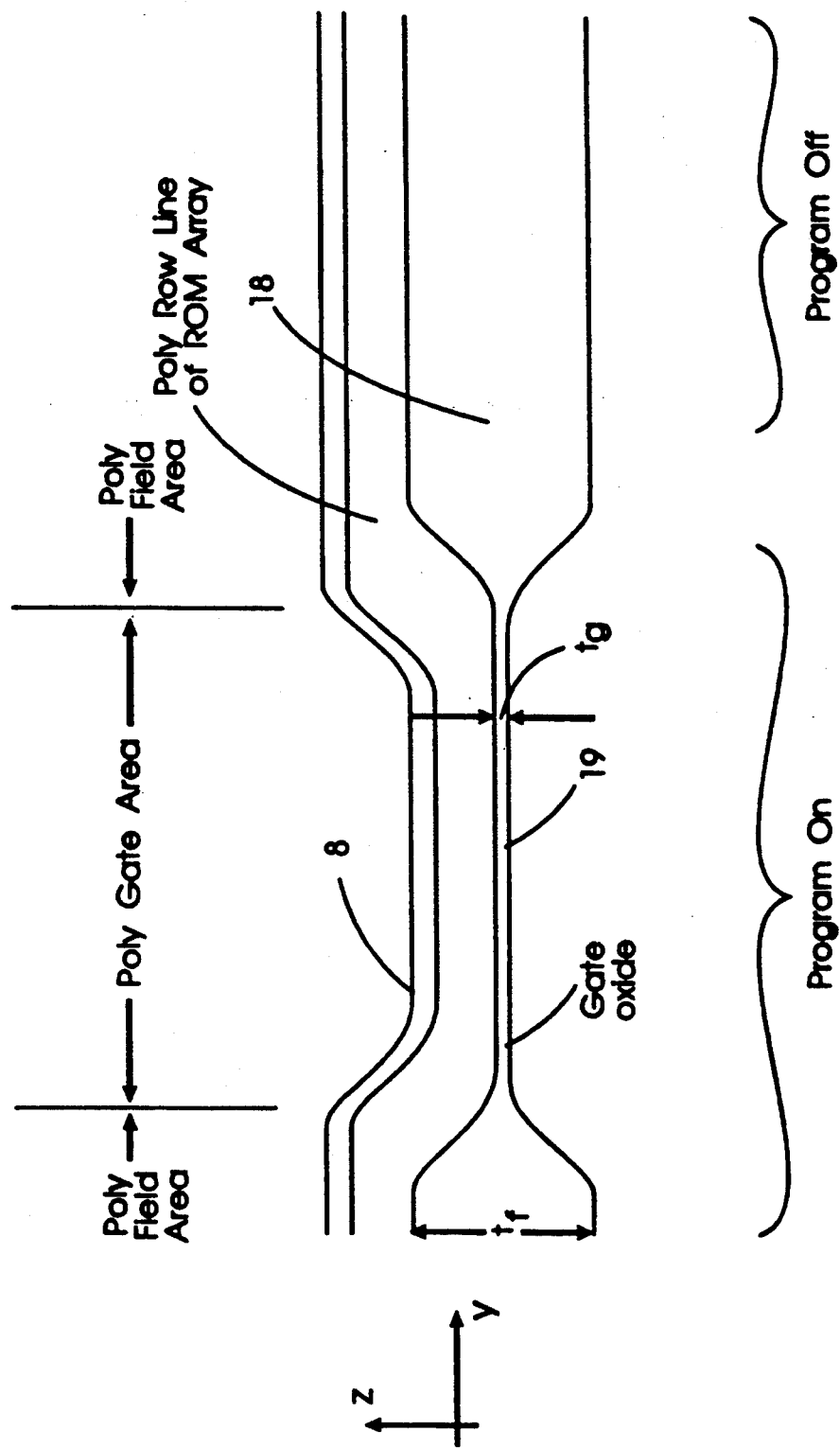
FIG. 2 is a cross-sectional view of a prior art ROM device in another plane.

A comparison of cell 24, which is programmed to store a "0", and cell 40, which is programmed to store a "1", illustrates that conductivity of the cell transistor is not governed by the thickness of the gate oxide as in the prior art device of FIG. 1. Instead, the conductivity of the cell transistor is determined by the presence or absence of P+ type implant 56 to inhibit the flow of charge between the source and the drain. For this reason, the gate oxides of the ROM array may be constructed to uniform thickness regardless of the desired programmed value of the ROM cell. Thus, gate oxide 34 under gate 36 of cell 24 need not be constructed thinner than oxide 52 under gate 54 of cell 4. The ratio of field oxide (6,000 Å) to gate oxide thickness (200 Å) remains on the order of 30, typical for conventional field effect transistors. High potential poly-to-substrate differences, caused by a poly line of which the majority is over field oxide and only a small percentage (less than 10%) is over thin gate oxide, which can result in gate oxide rupture and a failure of the ROM cell, are avoided. Product yield and reliability are thereby increased.

Figure 6:
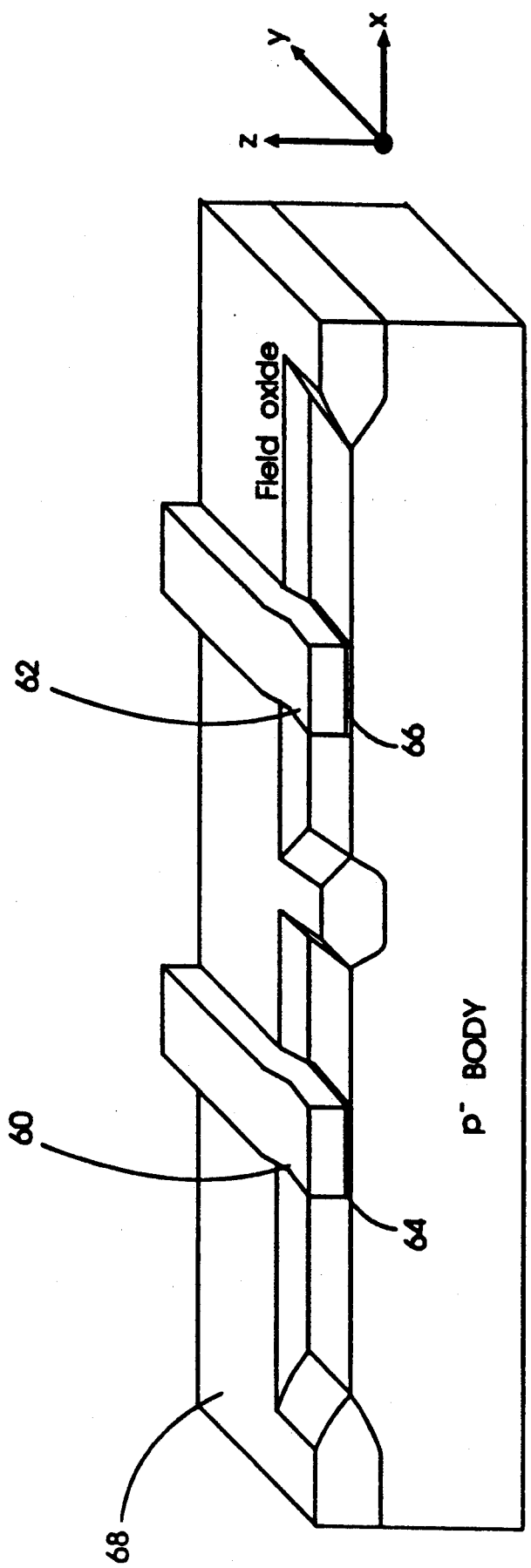
FIG. 6 is a perspective view of a partially completed ROM according to an embodiment of the present invention.

In a preferred embodiment, the P+ implant used to form region 56 is implanted late in a standard CMOS process used to form the ROM device. FIG. 6 is a perspective view of a partially completed ROM device useful for explaining a process for fabricating the ROM device of the present invention. The partially completed ROM of FIG. 6 illustrates two ROM cells having a common source region. The device contains two polysilicon gate regions 60 and 62 formed over gate oxide regions 64 and 66. Oxide regions 64 and 66, as well as polysilicon gate regions 60 and 62, and field oxide region 68, are formed according to techniques well known in the art.

Figure 7:
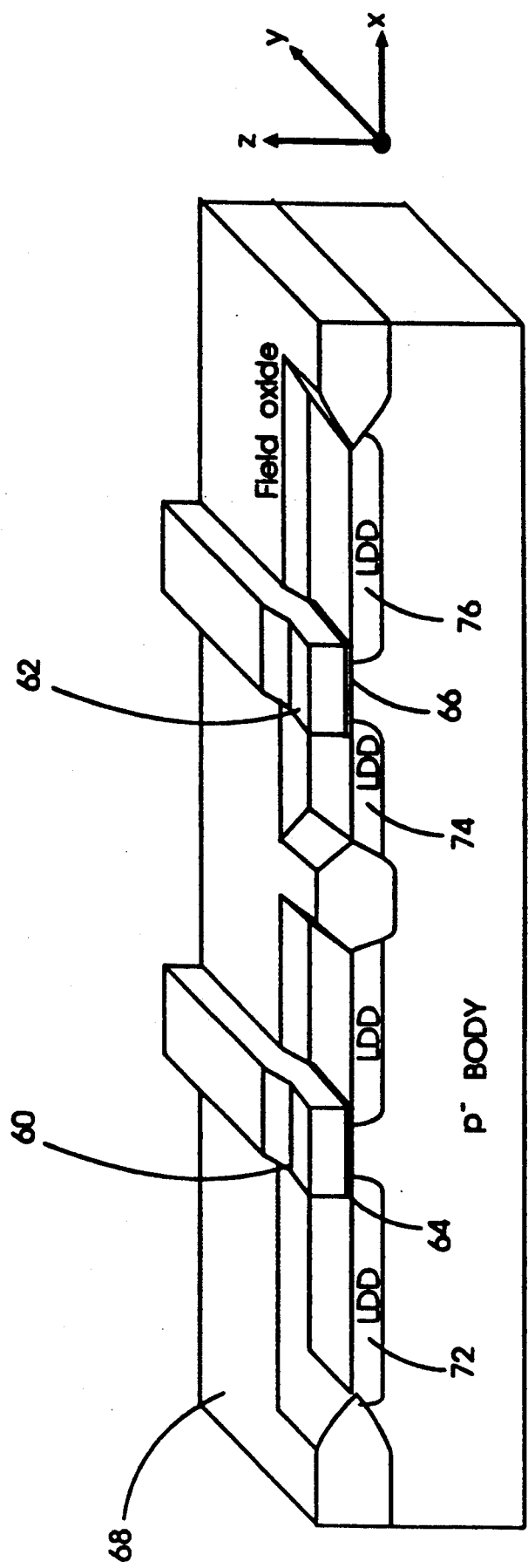
FIG. 7 is a perspective view of a partially completed ROM in which lightly doped drain and source electrode regions have been formed according to an embodiment of the present invention.

Next, as shown in FIG. 7, the structure of FIG. 6 has been doped with N conductivity type impurity using well-known techniques to form N type regions where the structure is not covered with polysilicon or field oxide. As a result, lightly doped N type regions 72, 74 and 76 are formed. The lightly doped regions are doped to an impurity concentration density of approximately $2 \times 10^{17}$ atoms/cm$^3$ with phosphorous.

Figure 8:
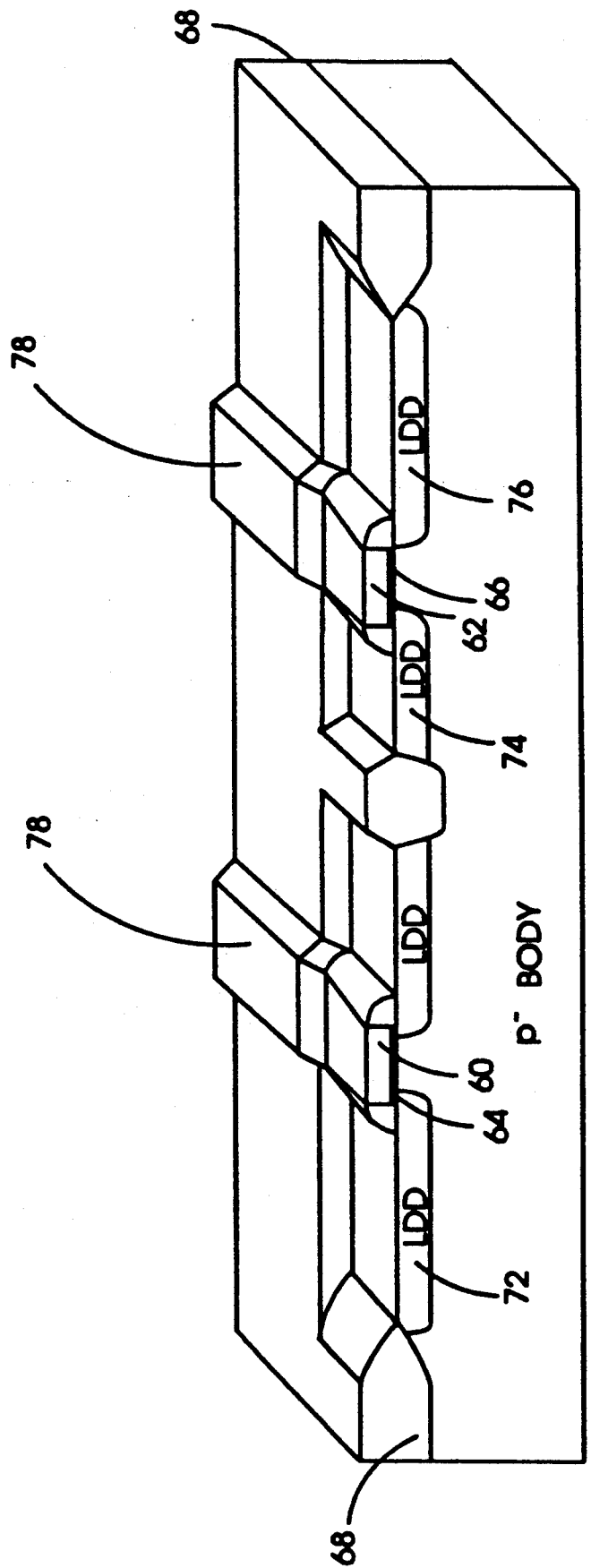
FIG. 8 is a perspective view of a partially completed ROM in which a silicon dioxide spacer has been grown and etched back according to the embodiment of the present invention.
Figure 9:
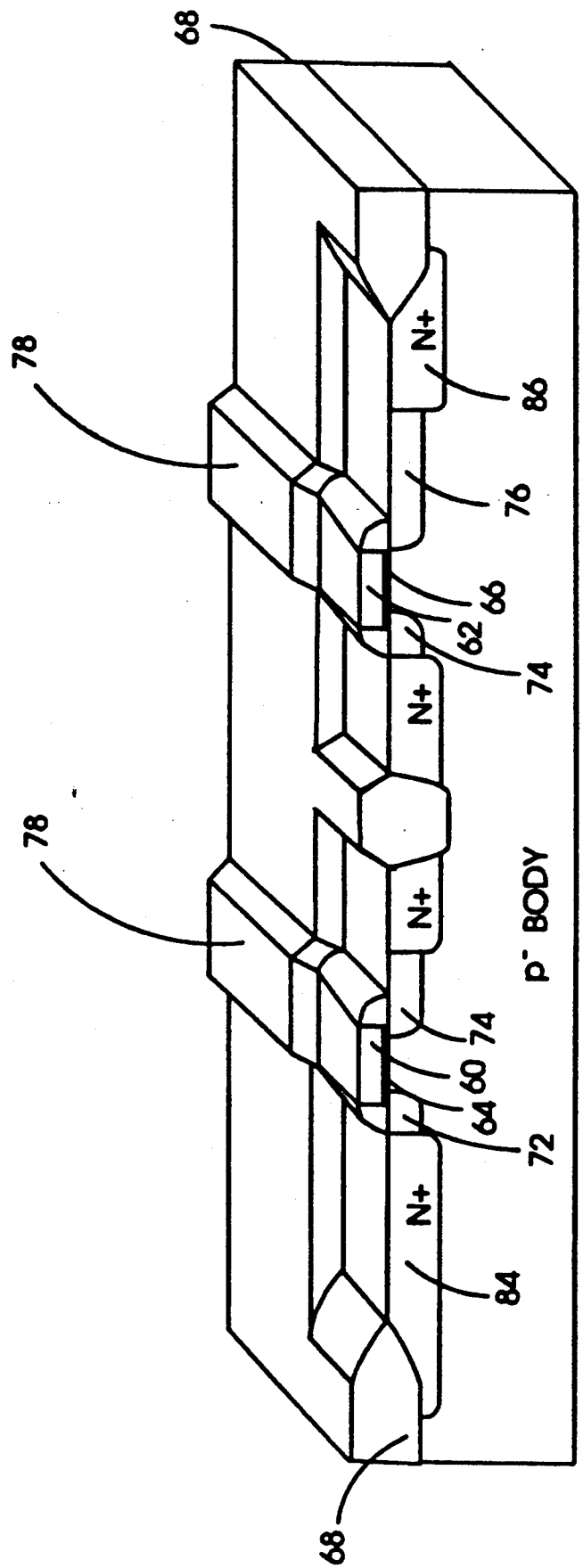
FIG. 9 is a perspective view of a partially completed ROM in which an N type dopant has been implanted to form drain and source regions according to an embodiment of the present invention.

In FIG. 8, an oxide spacer 78 has been thermally grown and etched back to form an N+ select mask according to well-known techniques. The structure of FIG. 8 is then doped using techniques well known to those of skill in the art to form N+ regions 84, 85 and 86 as depicted in FIG. 9. The N+ type regions have a concentration density of $10^{20}$ atoms/cm$^3$ of arsenic.

Figure 10:
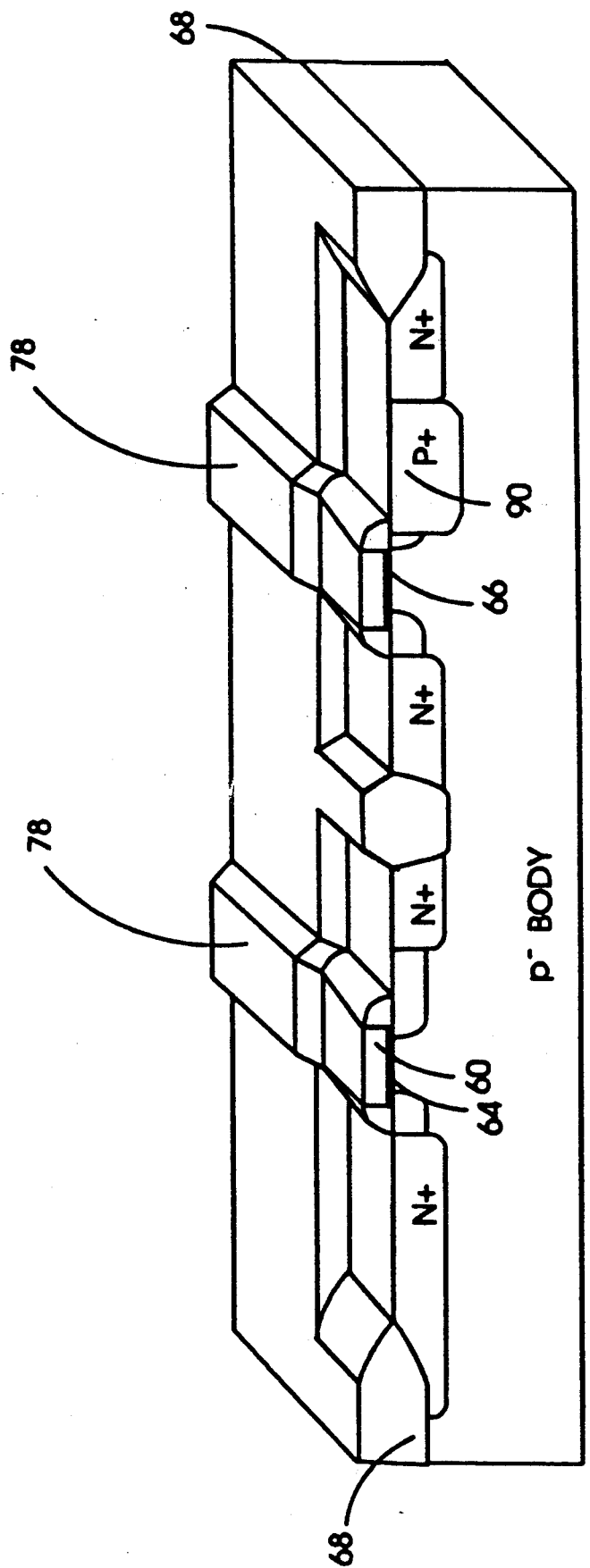
FIG. 10 is a perspective view of a partially completed ROM having a ROM cell with P+ implant to program the cell in an inactive state according to an embodiment of the present invention.

In a typical CMOS fabrication process, a negative (or complement) of the N select mask then would be applied to the structure of FIG. 9 to define the P+ source/drain regions of PMOS transistors on the CMOS device. In this process, the complement mask of the CMOS process flow may be used in addition to define the location of the P+ implant in the programmed off cell of the present invention, by opening the mask in the region where the P+ implant is desired. The resulting structure is as shown in FIG. 10, where the transistor on the right of the drawing has been subjected to the P+ implant 90, thereby programming the transistor to the inactive state; and the transistor on the left of the drawing has been masked such that a P+ implant is not formed. Note that all ROM transistors have the gap in source N+ so that only the P+ mask need be used to program the array. The LDD N-type implant bridges the gap to allow the devices without P+ to conduct current from source to drain. Metal layers are then deposited on the structure to provide interconnections. The structure of the present invention therefore may be achieved without deviation from processes used to form CMOS devices. The approximate concentration density of the P+ type impurity, boron in this process, is $5 \times 10^{19}$ atoms/cm$^3$.

Figure 11:
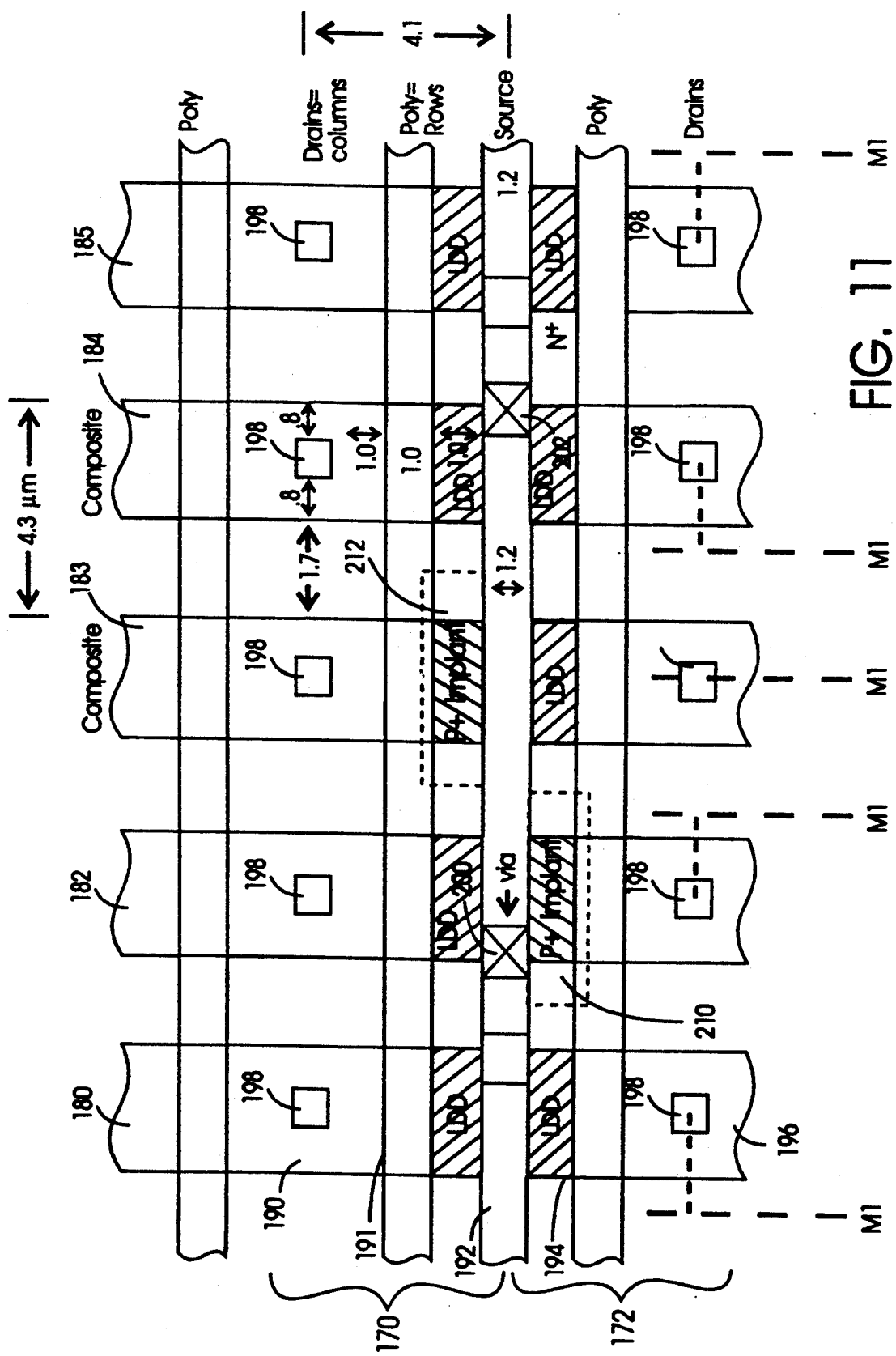
FIG. 11 is a top view of a ROM device constructed in a "T" structure according to an embodiment of the present invention.

FIG. 11 is a top view of a ROM cell layout achieved using the techniques of this invention. In FIG. 11 the ROM cells are arranged in orthogonal rows and columns to form a "T" layout. In FIG. 11 two rows, 170 and 172, and five columns, 180–185 of transistors are shown to form a 2×5 matrix. Of course, matrices as large as desired may be fabricated. The structure compactly arranges the ROM transistors. For example, the transistor located in row 170, column 180 is composed of drain 190, polysilicon gate 191 and source 192. The transistor located in row 172, column 180 is composed of source 192, polysilicon gate 194 and drain 196. The drain vias 198 contact an overlying metal layer M1 as shown in the figure. A second layer of metal M2 (not shown) is used to contact source regions of the devices. Vias 200 and 202 provide contact to metal layer M2. Approximate dimensions for a preferred embodiment are shown in microns in FIG. 11. For the dimensions shown, the device has an area density of 17.6 $\mu$m$^2$/ROM bit.

Because no P+ implant was employed, further inspection of FIG. 11 reveals that both of the transistors located in column 180 store a "0". The transistors located in row 70, column 83 and in row 172 column 182, however, are constructed to store a "1". Both transistors contain a P+ type implant 210, 212 in between the gate and the source regions of the respective device as previously described. Note that in the structure of the present invention, cells which are programmed "off" are visually indistinguishable from those cells which are programmed "on". In the typical ROM cells depicted in FIG. 1, the distinguishing physical feature of the "on" cell, the thinner gate oxide, is located underneath the polysilicon gate material and can be visually inspected. The structure of the present invention therefore provides an added means of security of ROM program.

Because the P+ implant concentration density in a CMOS process is on the order of $5 \times 10^{19}$ atoms/cm$^3$ and the N+ concentration density is $10^{20}$ atoms/cm$^3$, the diode 62 (see FIG. 5) formed at the N+/P+ interface will leak current under reverse bias when the structure of the present invention is formed using the previously described method. Since the P type implant forms ohmic contact to the P type body, the source cannot be at a higher voltage than the P type body. This restriction limits the number of transistors tied to a single node. The "T" layout described above, which has two transistors tied to a single drain node therefore is employed.

Figure 12:
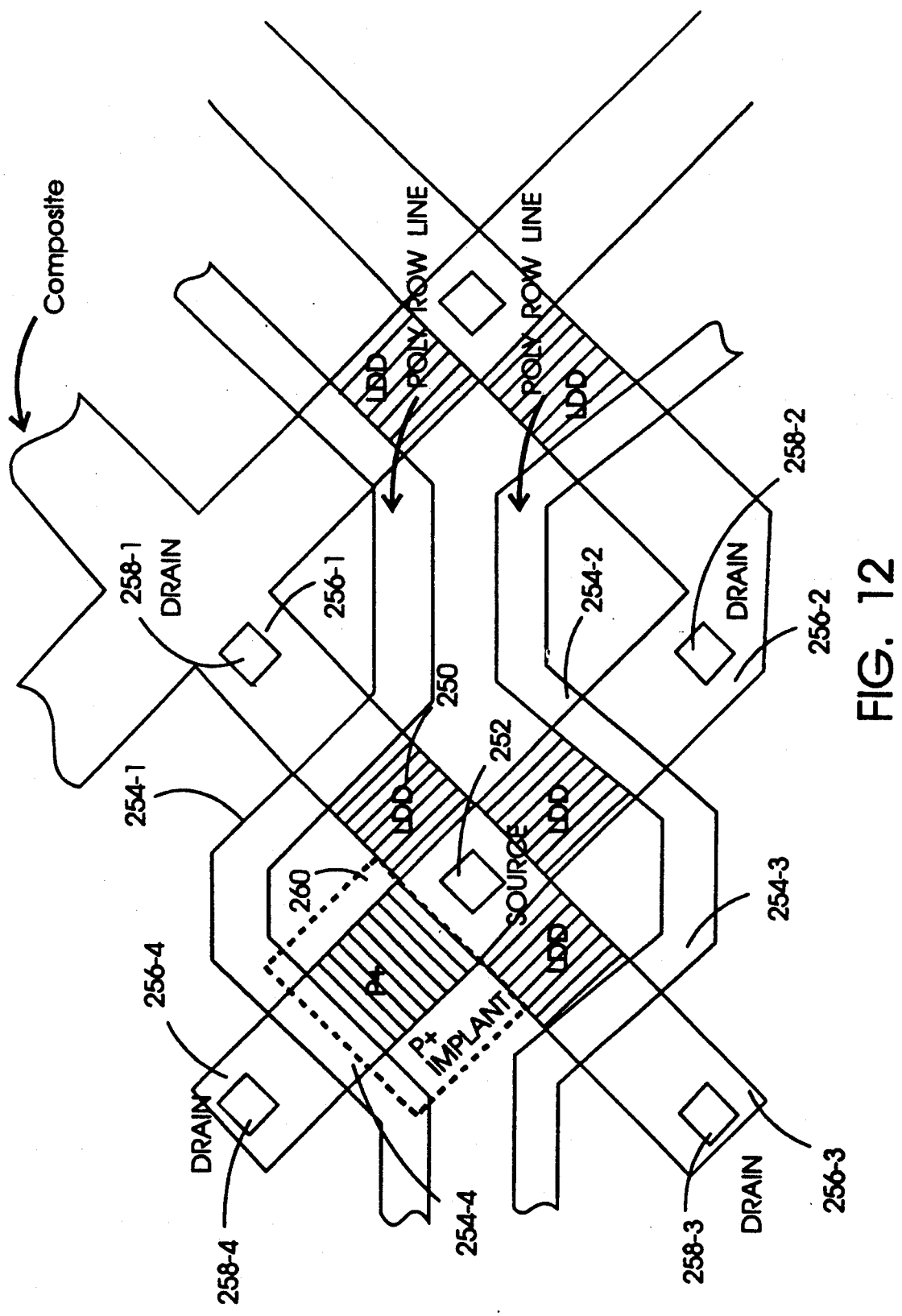
FIG. 12 is a top view of a ROM device constructed in an "X" structure according to an embodiment of the present invention.

An "X" layout may be used to provide increased area density per bit. For example, for the embodiment of FIG. 12, a density of 12.5 $\mu$m$^2$/ROM bit is achieved. FIG. 12 is a top view of a ROM device having four cells in "X" layout. The four cells each share a common source 250 which is contacted through a contact 252. Each cell has a polysilicon gate 254 and drains 256. The drains are contacted using vias 258 to a metal layer. A P+ implant 260 is shown for one of the cells, programming that cell to the inactive state. The remaining cells are not programmed, and thus are in the active state. Note that each drain contact is shared by 4 devices and each source contact is shared by 4 devices. In order to decode the memory address to a particular ROM transistor in this structure, ground potential is provided only to odd or even number source columns; therefore, a requirement for no leakage between source and ground exists.

Figure 13:
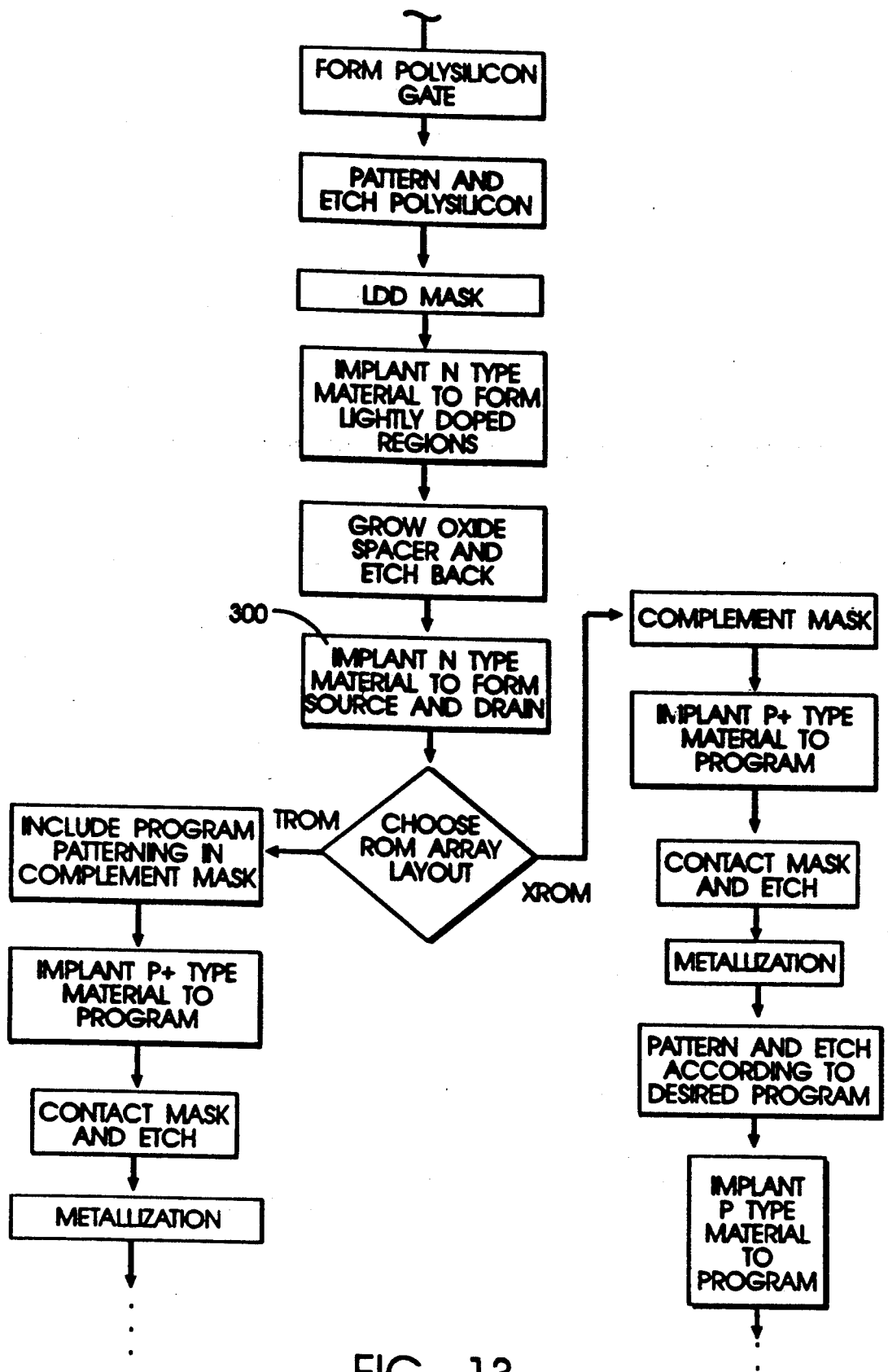
FIG. 13 is a flow chart of a process according to an embodiment of the present invention used to form a ROM having an "X" or "T" and incorporating a ROM cell with P+ implant.

The "X" ROM layout may be formed by altering the process described above to include an additional masking step for the P implant used to program the ROM. The additional masking step is an added step to a typical CMOS process flow and therefore allows use of a lighter dose implant of P type material than normal. For example an implant having an approximate concentration density of $5 \times 10^{17}$ atoms/cm$^3$ of boron may be employed. This concentration density is enough to overcompensate the lightly doped regions which have a concentration density of phosphorous of $2 \times 10^{17}$ atoms/cm$^3$. The programming mask can be used after deposition of metal on the structure. FIG. 13 is a flow chart of the process flows used to form a ROM device incorporating the present invention in an "X" layout and a "T" layout. As may be seen, the process flows are similar, except that after formation of the drain and source regions in step 300, implantation of the P+ region and metallization occur in a different sequence.

A preferred embodiment of the present invention has now been described. Variations and modifications will be readily apparent to those of ordinary skill in the art. For example, a ROM device of opposite polarity may be fabricated by substitution of P type dopants for N type dopants and vice versa. For this reason, the invention should be construed in light of the claims.

What is claimed is:

1. In a ROM device formed on a substrate and having a plurality of individual storage cells programmed to an active state and a plurality of storage cells programmed to an inactive state, a cell structure for the cells programmed to the inactive state comprising:
   an insulating layer disposed on the substrate;
   an electrically-conductive gate electrode disposed on the insulating layer;
   a drain region of first conductivity type disposed in the substrate adjacent to the region of substrate directly below the gate electrode;
   an implant region of opposite conductivity type disposed in the substrate adjacent to the region of substrate directly below the gate electrode but spaced apart from the drain region; and
   a source region of first conductivity type formed in the substrate adjacent the implant region and separated from the gate electrode by the implant region.

2. The cell structure of claim 1 wherein the gate electrode comprises polycrystalline silicon.

3. The cell structure of claim 1 wherein the first conductivity type comprises N type and the opposite conductivity type comprises P type.

4. The cell structure of claim 1 wherein the implant has a dopant concentration density between approximately $5 \times 10^{17}$ and $5 \times 10^{19}$ atoms/cm$^3$ inclusive.

5. A ROM device formed on a substrate comprising:
   a plurality of storage cells programmed to an inactive state having:
   (i) a first source of a first conductivity type;
   (ii) an implant of a second conductivity type, adjacent the first source;
   (iii) a first drain formed of the first conductivity type and spaced a given distance from the implant;
   (iv) a first polysilicon gate, located on a surface of the substrate and having a first region adjacent the first drain and a second region adjacent the implant;
   (v) a first silicon dioxide layer disposed between the first polysilicon gate and the surface of the substrate;
   a plurality of storage cells programmed to an active state having:
   (i) a second source of the first conductivity type;
   (ii) a second drain formed of the first conductivity type and spaced a given distance from the second source;
   (iii) a second polysilicon gate, located on a surface of the substrate and having a first region adjacent the second drain and a second region adjacent the second source; and
   (iv) a second silicon dioxide layer disposed between the polysilicon gate and the surface of the substrate.

6. The ROM of claim 5 wherein the storage cells are arranged to form a "T" layout.

7. The ROM of claim 5 wherein the plurality of storage cells are arranged to form an "X" layout.

8. The ROM of claim 5 wherein the first and the second drains further comprise a drain electrode formed of the first conductivity type and located adjacent the first regions of the first and second polysilicon gates respectively.

9. The ROM of claim 5 wherein the first conductivity type comprises an N type material and the second conductivity type comprises a P type material.

10. The ROM of claim 5 wherein the first source and the substrate are at a substantially identical electrical potential.

11. The ROM of claim 6 wherein the implant has a dopant concentration density of approximately $5 \times 10^{19}$ atoms/cm$^3$.

12. The ROM of claim 7 wherein the implant has a dopant concentration density of approximately $5 \times 10^{17}$ atoms/cm$^3$.

13. In a ROM device formed on a substrate and having a plurality of individual storage cells programmed to an active state and a plurality of cells programmed to an inactive state, a cell structure for the cells programmed to the inactive state comprising:
   a gate electrode disposed on a surface of said substrate;
   a drain region of a first conductivity type disposed in the substrate and having a heavily doped main portion and a lightly doped drain electrode portion wherein said drain electrode adjoins said gate electrode; and
   a source region of said first conductivity type disposed in the substrate adjoining said gate electrode and separated from said drain region wherein said source region includes:
   (i) a heavily doped main portion and a lightly doped source electrode portion of said first conductivity type; and
   (ii) an implant region of a second conductivity type implanted in said lightly doped source electrode region whereby said heavily doped main portion is separated from said gate electrode by said implant region.

14. The ROM of claim 13 wherein the storage cells are arranged to form a "T" layout.

15. The ROM of claim 13 wherein the plurality of storage cells are arranged to form an "X" layout.

16. The ROM of claim 13 wherein the first conductivity type comprises an N type material and the second conductivity type comprises a P type material.

17. The ROM of claim 13 wherein the first source and the substrate are at a substantially identical electrical potential.

18. The ROM of claim 14 wherein the implant has a dopant concentration density of approximately $5 \times 10^{19}$ atoms/cm$^3$.

19. The ROM of claim 15 wherein the implant has a dopant concentration density of approximately $5 \times 10^{17}$ atoms/cm$^3$.

20. The ROM of claim 5 wherein the second source further comprises a source electrode formed of the first conductivity type and located adjacent the second region of the second polysilicon gate.

21. The ROM of claim 5 wherein said implant of a second conductivity type is formed in a source electrode of said first diode and whereby a diode is formed between said implant and said first source.

22. The cell structure of claim 1 wherein the ROM device has predefined operating ranges for voltages applied to the gate, source and drain regions and wherein there is substantially no current flow for any combination of gate, source and drain voltages within the operating ranges.

* * * * *